United States Patent
Tsai

(10) Patent No.: US 8,488,311 B2
(45) Date of Patent: Jul. 16, 2013

(54) CONTAINER DATA CENTER

(75) Inventor: Ming-Shang Tsai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 199 days.

(21) Appl. No.: 13/207,421

(22) Filed: Aug. 11, 2011

(65) Prior Publication Data

US 2012/0170193 A1 Jul. 5, 2012

(30) Foreign Application Priority Data

Dec. 31, 2010 (TW) .............................. 99147082 A

(51) Int. Cl.
*H05K 7/20* (2006.01)
*B60H 1/00* (2006.01)

(52) U.S. Cl.
USPC ............ 361/679.46; 361/679.47; 361/679.48; 361/679.5; 361/690; 361/695; 361/696; 361/699; 165/80.2; 165/104.33; 165/121; 165/122; 454/184; 454/187; 454/118; 700/19; 700/22; 700/292

(58) Field of Classification Search
USPC ............... 361/679.46–679.53, 690–696, 688, 361/689, 698–702, 717, 800; 165/80.2–80.5, 165/104.14, 104.26, 121–126, 185; 454/118, 454/184, 187, 229, 228, 230, 236, 237, 251; 312/223.2, 223.3, 236, 201, 265; 700/19, 700/22, 276–278, 292, 299, 360; 206/223; 211/162; 62/259.2
See application file for complete search history.

(56) References Cited

U.S. PATENT DOCUMENTS

| | | | | |
|---|---|---|---|---|
| 4,409,889 | A | * | 10/1983 | Burleson ....................... 454/187 |
| 5,692,954 | A | * | 12/1997 | Lee et al. ...................... 454/187 |
| 5,816,908 | A | * | 10/1998 | Tsou .............................. 454/187 |
| 7,278,273 | B1 | * | 10/2007 | Whitted et al. .............. 62/259.2 |
| 7,465,225 | B2 | * | 12/2008 | Ohmura et al. ............... 454/187 |
| 7,511,959 | B2 | * | 3/2009 | Belady et al. ................. 361/701 |
| 7,511,960 | B2 | * | 3/2009 | Hillis et al. ................... 361/702 |
| 7,724,513 | B2 | * | 5/2010 | Coglitore et al. ........ 361/679.47 |
| 7,738,251 | B2 | * | 6/2010 | Clidaras et al. ............... 361/701 |
| 7,852,627 | B2 | * | 12/2010 | Schmitt et al. ............... 361/695 |
| 7,971,446 | B2 | * | 7/2011 | Clidaras et al. ............. 62/259.2 |
| 7,990,710 | B2 | * | 8/2011 | Hellriegel et al. ........... 361/699 |
| 8,046,896 | B2 | * | 11/2011 | Schmitt et al. ................. 29/469 |
| 8,251,785 | B2 | * | 8/2012 | Schmitt et al. ............... 454/184 |
| 8,310,829 | B2 | * | 11/2012 | Monk et al. .................. 361/696 |
| 8,434,804 | B2 | * | 5/2013 | Slessman .................... 296/24.3 |
| 2006/0082263 | A1 | * | 4/2006 | Rimler et al. ................. 312/201 |
| 2007/0066205 | A1 | * | 3/2007 | Ohmura et al. ................. 454/66 |
| 2008/0055850 | A1 | * | 3/2008 | Carlson et al. ............... 361/695 |

(Continued)

FOREIGN PATENT DOCUMENTS

JP 2005199152 A * 7/2005

*Primary Examiner* — Michail V Datskovskiy
(74) *Attorney, Agent, or Firm* — Altis Law Group, Inc.

(57) ABSTRACT

A container data center includes a mobile container and a number of servers. The mobile container includes a main room receiving the servers, and an air shower room isolated from the main room. The air shower room includes an outer door, an inner door, a blower, and a dust absorber. The outer door connects the air shower room and is used to separate the air shower room from the outer environment. The inner door connects the air shower room and is used to separate the air shower room from the main room. The blower and the dust absorber are secured on two opposite walls of the air shower room respectively, the blower being configured for blowing air towards the dust absorber.

17 Claims, 2 Drawing Sheets

U.S. PATENT DOCUMENTS

2009/0229194 A1* 9/2009 Armillas .................. 52/79.1
2010/0051563 A1* 3/2010 Schreiber ................ 211/26
2011/0083824 A1* 4/2011 Rogers .................. 165/80.2
2011/0189936 A1* 8/2011 Haspers et al. ............ 454/184
2011/0240497 A1* 10/2011 Dechene et al. .......... 206/320
2012/0040600 A1* 2/2012 Ortner .................. 454/187

* cited by examiner

CONTAINER DATA CENTER

BACKGROUND

1. Technical Field

The present disclosure relates to container data centers and, particularly, to a container data center with an air shower room for preventing dust entering the container data center.

2. Description of Related Art

At present, racks of servers are arranged in a container, together with relevant equipments, to form a portable container data center, which can be employed in all kinds of locations. However, operators usually have to enter the container to mend or operate the servers received in the container. The dust attached to the operators will enter the container together with the operators. As a result, dust may enter the container.

What is needed is a container data center which can ameliorate the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
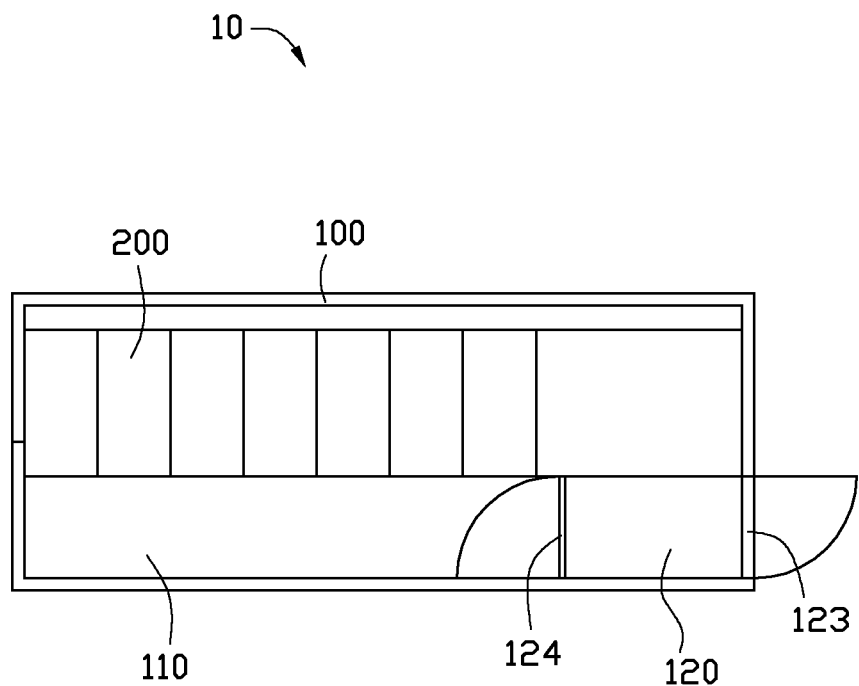
FIG. 1 is a schematic view of a container data center according to an exemplary embodiment.

Referring to FIG. 1, a container data center 10 according to an exemplary embodiment is shown. The container data center 10 includes a mobile container 100 and a number of servers 200 placed in the mobile container 100.

The mobile container 100 includes a main room 110 and an air shower room 120 isolated from the main room 110.

The servers 200 are placed in the main room 110. In the present embodiment, the servers 200 are substantially parallel to each other, and arranged adjacent to a longer wall of the main room 110. In order that the servers 200 have a good heat dissipating efficiency, a gap is defined between each of the servers 200 and the longer wall of the main room 110.

Figure 2:
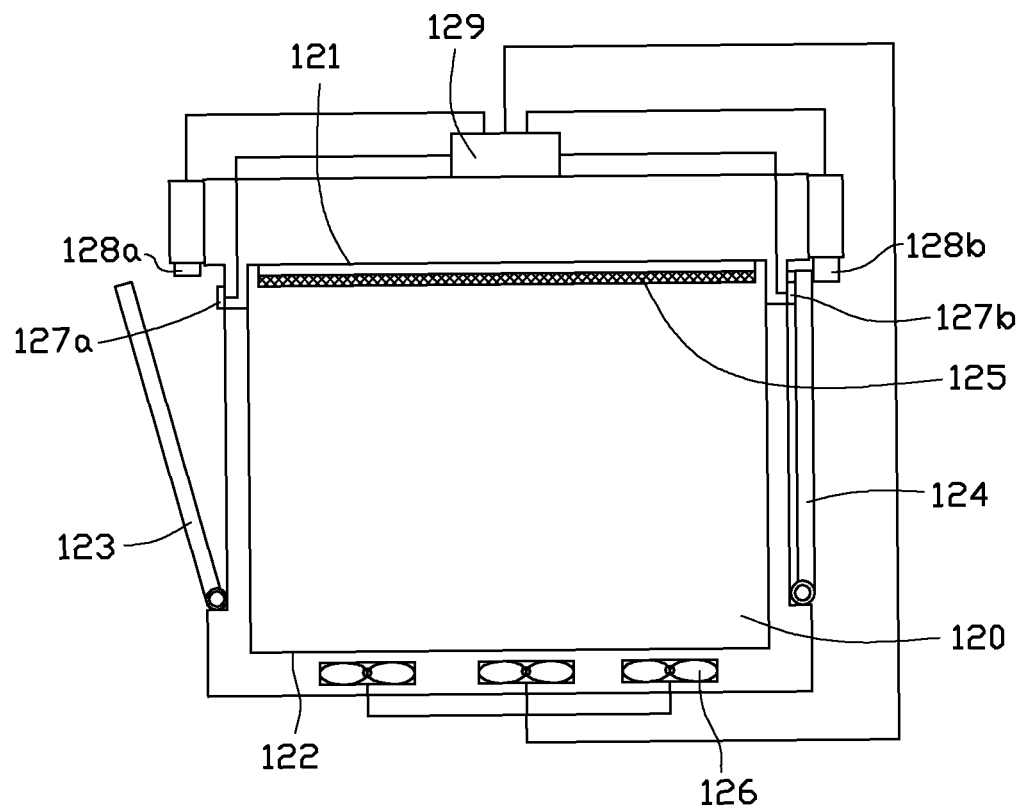
FIG. 2 is a schematic view of an air shower room of the container data center of FIG. 1.

Further referring to FIG. 2, the air shower room 120 includes a first sidewall 121, a second sidewall 122, an outer door 123, an inner door 124, a dust absorber 125 and a number of blowers 126.

The first sidewall 121 is opposite to the second sidewall 122. The dust absorber 125 is secured on the first sidewall 121, and the blowers 126 are secured on the second sidewall 122. The blowers 126 can blow the air inside the air shower room 120 towards the first sidewall 121, thus, the dust suspending in the air can be absorbed by the dust absorber 125 secured on the first sidewall 121.

The outer door 123 rotatably connects the air shower room 120 and is used for separating the air shower room 120 from the outer environment. The inner door 124 rotatably connects the air shower room 120 and is used for separating the air shower room 120 from the main room 110. Operators in outer environment can enter the air shower room 120 by opening the outer door 123, and can enter the main room 110 by opening the inner door 124. In the present embodiment, the outer door 123 and the inner door 124 are arranged at two opposite sides of the air shower room 120 respectively.

The air shower room 120 further includes a first trigger button 127a, a second trigger button 127b, a first lock 128a, a second lock 128b and a controller 129. The first trigger button 127a, the second trigger button 127b, the first lock 128a and the second lock 128b are electrically connected to the controller 129.

The first lock 128a and the second lock 128b are configured for locking the outer door 123 and the inner door 124 respectively. The first trigger button 127a is configured for controlling the state of the second lock 128b via the controller 129 to lock or unlock the inner door 124. The second trigger button 127b is configured for controlling the state of the first lock 128a via the controller 129 to lock or unlock the outer door 123. When the first trigger button 127a is pressed, the second lock 128b will unlock the inner door 124, while the first trigger button 127a is not pressed, the second lock 128b will lock the inner door 124. Similarly, when the second trigger button 127b is pressed, the first lock 128a will unlock the outer door 123, while the second trigger button 127b is not pressed, the first lock 128a will lock the outer door 123.

The first trigger button 127a and the second trigger button 127b can be pressed by the outer door 123 and the inner door 124 respectively. For example, when the outer door 123 being shut down, the first trigger button 127a will be pressed by the outer door 123, and the first trigger button 127a will control the second lock 128b to unlock the inner door 124, thus, when the outer door 123 is shut down, the inner door 124 can be opened. The first trigger button 127a, the second trigger button 127b, the first lock 128a and the second lock 128b cooperatively make the outer door 123 and the inner door 124 cannot be opened at the same time, therefore, there will be less dust, water vapor etc. enter the main room 110 from the outer environment.

In the present embodiment, operators should enter the air shower room 120 first before entering the main room 110. The blowers 126 can blow off dust attached to the operators, and the dust absorber 125 can absorb the dust blown off by the blowers 126, therefore, there will be less dust bring into the main room 110 by the operators.

It is understood, in other embodiments, the blowers 126 and the dust absorber 125 can also be secured at another two opposite walls of the air shower room 120, such as a top wall and a bottom wall of the air shower room 120.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. A container data center comprising:
   a plurality of servers; and
   a mobile container comprising:
      a main room receiving the plurality of servers; and
      an air shower room isolated from the main room, the air shower room comprising:
         an outer door connecting the air shower room and configured to separate the air shower room from the outer environment;

an inner door connecting the air shower room and configured to separate the air shower room from the main room;

at least one blower; and a dust absorber, the at least one blower and the dust absorber being received in the air shower room and secured on two opposite walls of the air shower room, the at least one blower being configured for blowing air towards the dust absorber.

2. The container data center as claimed in claim 1, wherein the air shower room comprises a first sidewall and a second sidewall opposite to the first sidewall, the dust absorber is secured on the first sidewall, and the at least one blower is secured on the second sidewall.

3. The container data center as claimed in claim 1, wherein a gap is defined between each of the servers and a wall of the main room.

4. The container data center as claimed in claim 1, wherein the outer door and the inner door are arranged at two opposite sides of the air shower room.

5. The container data center as claimed in claim 1, wherein the air shower room further comprises a first trigger button adjacent to the outer door, a second trigger button adjacent to the inner door, a first lock electrically connected to the second trigger button and controlled by the second trigger button to lock the outer door, and a second lock electrically connected to the first trigger button and controlled by the first trigger button to lock the inner door.

6. The container data center as claimed in claim 5, wherein the first trigger button is triggered by opening and closing the outer door, when the outer door is closed, the first trigger button is triggered to control the second lock to unlock the inner door, and when the outer door is opened, the first trigger button is triggered to control the second lock to lock the inner door.

7. The container data center as claimed in claim 6, wherein the first trigger button is triggered by being pressed by the outer door and being released from the outer door.

8. The container data center as claimed in claim 5, wherein the second trigger button is triggered by opening and closing the inner door, when the inner door is closed, the second trigger button is triggered to control the first lock to unlock the outer door, and when the inner door is opened, the second trigger button is triggered to control the first lock to lock the outer door.

9. The container data center as claimed in claim 8, wherein the second trigger button is triggered by being pressed by the inner door and being released from the inner door.

10. A mobile container comprising:

a main room for receiving a plurality of servers; and an air shower room isolated from the main room, the air shower room comprising:

an outer door connecting the air shower room and configured to separate the air shower room from the outer environment;

an inner door connecting the air shower room and configured to separate the air shower room from the main room;

at least one blower; and a dust absorber, the at least one blower and the dust absorber being secured on two opposite walls of the air shower room respectively, the at least one blower being configured for blowing air towards the dust absorber.

11. The mobile container as claimed in claim 10, wherein the air shower room comprises a first sidewall and a second sidewall opposite to the first sidewall, the dust absorber is secured on the first sidewall, and the at least one blower is secured on the second sidewall.

12. The mobile container as claimed in claim 10, wherein the outer door and the inner door are arranged at two opposite sides of the air shower room.

13. The mobile container as claimed in claim 10, wherein the air shower room further comprises a first trigger button adjacent to the outer door, a second trigger button adjacent to the inner door, a first lock electrically connected to the second trigger button and controlled by the second trigger button to lock the outer door, and a second lock electrically connected to the first trigger button and controlled by the first trigger button to lock the inner door.

14. The mobile container as claimed in claim 13, wherein the first trigger button is triggered by opening and closing the outer door, when the outer door is closed, the first trigger button is triggered to control the second lock to unlock the inner door, and when the outer door is opened, the first trigger button is triggered to control the second lock to lock the inner door.

15. The mobile container as claimed in claim 14, wherein the first trigger button is triggered by being pressed by the outer door and being released from the outer door.

16. The mobile container as claimed in claim 13, wherein the second trigger button is triggered by opening and closing the inner door, when the inner door is closed, the second trigger button is triggered to control the first lock to unlock the outer door, and when the inner door is opened, the second trigger button is triggered to control the first lock to lock the outer door.

17. The mobile container as claimed in claim 16, wherein the second trigger button is triggered by being pressed by the inner door and being released from the inner door.

\* \* \* \* \*